United States Patent
Lim et al.

(10) Patent No.: US 8,737,153 B2
(45) Date of Patent: May 27, 2014

(54) MEMORY DEVICE, METHOD OF OPERATING THE SAME, AND APPARATUS INCLUDING THE SAME

(75) Inventors: Young-Il Lim, Suwon-si (KR); Cheol Kim, Seoul (KR); Jung Sik Kim, Seoul (KR); Yun Sang Lee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 58 days.

(21) Appl. No.: 13/613,492

(22) Filed: Sep. 13, 2012

(65) Prior Publication Data

US 2013/0182522 A1    Jul. 18, 2013

(30) Foreign Application Priority Data

Jan. 17, 2012    (KR) .................. 10-2012-0005082

(51) Int. Cl.
*G11C 11/402* (2006.01)
*G11C 11/406* (2006.01)
*G11C 8/12* (2006.01)

(52) U.S. Cl.
CPC ............ *G11C 11/406* (2013.01); *G11C 8/12* (2013.01)
USPC ...................... 365/222; 365/230.03

(58) Field of Classification Search
CPC .................. G11C 11/406; G11C 8/12
USPC .................. 365/222, 230.03
See application file for complete search history.

(56) References Cited

U.S. PATENT DOCUMENTS

| | | | |
|---|---|---|---|
| 7,663,956 | B2 | 2/2010 | Ishikawa |
| 7,760,572 | B2 | 7/2010 | Koshita |
| 7,961,543 | B2 | 6/2011 | Koshita |
| 2004/0042330 | A1* | 3/2004 | Matsubara .......... 365/232 |
| 2005/0108460 | A1 | 5/2005 | David |
| 2009/0021995 | A1* | 1/2009 | Oh .................. 365/189.16 |

FOREIGN PATENT DOCUMENTS

| | | |
|---|---|---|
| JP | 2008135113 | 6/2008 |
| JP | 2008146781 | 6/2008 |
| KR | 1020000027608 A | 5/2000 |
| KR | 1020070065564 A | 6/2007 |

\* cited by examiner

*Primary Examiner* — Michael Tran
(74) *Attorney, Agent, or Firm* — F. Chau & Associates, LLC

(57) ABSTRACT

A method of operating a memory device includes masking at least one bank among a plurality of banks in response to a mode register writing command; and performing a refresh operation on a plurality of rows in one of unmasked banks in response to a first per-bank refresh command.

20 Claims, 8 Drawing Sheets

MEMORY DEVICE, METHOD OF OPERATING THE SAME, AND APPARATUS INCLUDING THE SAME

CROSS-REFERENCE TO RELATED APPLICATIONS

This application claims priority under 35 U.S.C. §119(a) from Korean Patent Application No. 10-2012-0005082 filed on Jan. 17, 2012, the disclosure of which is herein incorporated by reference in its entirety.

BACKGROUND

Embodiments of the inventive concept relate to a memory device, and more particularly, to a memory device for performing a refresh operation on a plurality of rows per bank, a method of operating the same, and an apparatus including the same.

Memory devices are used in electronic devices to store data. When a memory device is implemented as a dynamic random access memory (DRAM), the memory device includes a plurality of banks. Each of the banks includes a plurality of rows or word lines, a plurality of bit lines, and a plurality of memory cells that store data.

A refresh operation is periodically performed in a DRAM. All the rows in the DRAM are subjected to the refresh operation. When a refresh operation is performed on each of the rows, an increase in an average time interval between refresh commands may reduce the number of refresh commands that a memory controller controlling the DRAM outputs to the DRAM.

SUMMARY

According to an embodiment of the inventive concept, there is provided a method of operating a memory device. The method includes masking at least one bank among a plurality of banks in response to a mode register writing command, and performing a refresh operation on a plurality of rows in one of unmasked banks in response to a first per-bank refresh command. Even when a second per-bank refresh command is received, the refresh operation may not be performed in the masked bank.

The masked bank may be determined according to a mode register setting.

The mode register writing command may be issued when a clock enable signal is at a high level at a rising edge of a clock signal, when a chip enable signal is at a low level, and when a plurality of command/address signals are at a low level.

The first per-bank refresh command may be issued when a clock enable signal is at a high level at a rising edge of a clock signal, a chip enable signal is at a low level, a first command/address signal is at a low level, a second command/address signal is at a low level, a third command/address signal is at a high level, and a fourth command/address signal is at a low level.

According to an embodiment of the inventive concept, there is provided a memory device including a plurality of banks, at least one of the banks including a plurality of rows, and a command decoder configured to issue a mode register writing command and a first per-bank refresh command according to a clock signal, a clock enable signal, a chip enable signal, and a plurality of command/address signals.

When at least one of the plurality of banks is masked in response to the mode register writing command, a refresh operation is performed on a plurality of rows included in a first bank among unmasked banks in response to the first per-bank refresh command.

The memory device may further include a bank control logic configured to switch from the first bank to a second bank in response to the first per-bank refresh command. The memory device may further include a refresh counter configured to count the plurality of rows in response to the first per-bank refresh command.

The command decoder may include a mode register configured to select the masked bank. When the command decoder issues a second per-bank refresh command, the refresh operation may not be performed in the masked bank.

The mode register writing command may be issued when the clock enable signal is at a high level at a rising edge of the clock signal, the chip enable signal is at a low level, and four of the plurality of command/address signals are at a low level.

The first per-bank refresh command may be issued when the clock enable signal is at a high level at a rising edge of the clock signal, the chip enable signal is at a low level, three of the command/address signals are at a low level, and one of the command/address signals is at a high level.

According to an embodiment of the inventive concept, there is provided a memory module including at least one rank including at least one memory device that has been described above. The memory module may be a dual in-line memory module (DIMM), a dual in-line package (DIP) memory module, a single in-line pin package (SIPP) memory module, a single in-line memory module (SIMM), or a small outline DIMM (SO-DIMM).

According to an embodiment of the inventive concept, there is provided a method of operating a memory device, the method including generating a mode register writing command or a bank refresh command according to values of a clock signal, a clock enable signal, a chip selection signal, and a plurality of command/address signals, masking at least one of a plurality of banks included in the memory device when receiving the mode register writing command, and skipping a refresh operation on word lines included in the masked bank when receiving the bank refresh command.

The mode register writing command is generated when the clock enable signal is at a high level, the clock signal is at a rising edge, the chip enable signal is at a low level, and the plurality of command/address signals are at a low level.

The bank refresh command is generated when the clock enable signal is at a high level, the clock signal is at a rising edge, the chip enable signal is at a low level, a first command/address signal of the command/address signals is at a low level, a second command/address signal of the command/address signals is at a low level, a third command/address signal of the command/address signals is at a high level, and a fourth command/address signal of the command/address signals is at a low level.

The method further includes performing the refresh operation on word lines included in an unmasked bank of the plurality of banks when receiving the bank refresh command.

The method further includes making a shift from the unmasked bank to a subsequent bank and performing the refresh operation on the subsequent bank when the subsequent bank is an unmasked bank or skipping the refresh operation on the subsequent bank when the subsequent bank is a masked bank.

The method further includes activating word lines included in at least one of the banks when receiving an activate command.

BRIEF DESCRIPTION OF THE DRAWINGS

The embodiments of the inventive concept will become more apparent by the detailed description with reference to the attached drawings in which.

DETAILED DESCRIPTION

Figure 1:
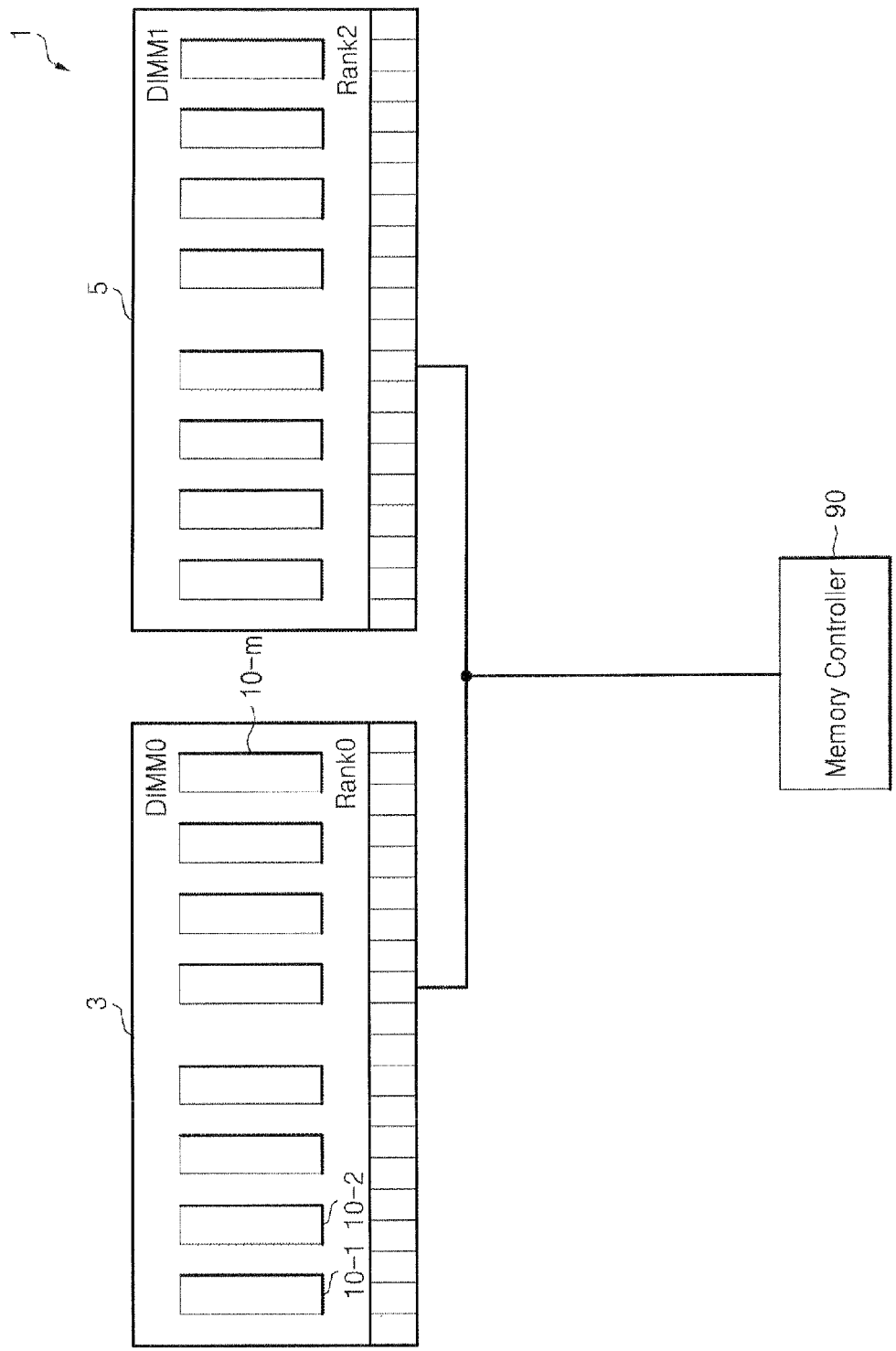
FIG. 1 is a block diagram illustrating a memory system according to an embodiment of the inventive concept.

Exemplary embodiments of the present inventive concept will be described more fully hereinafter with reference to the accompanying drawings. Like reference numerals may refer to like or similar elements throughout the drawings and the specification.

It will be understood that although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

As will be appreciated by one skilled in the art, embodiments of the present invention may be embodied as a system, method, computer program product, or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device.

Figure 2:
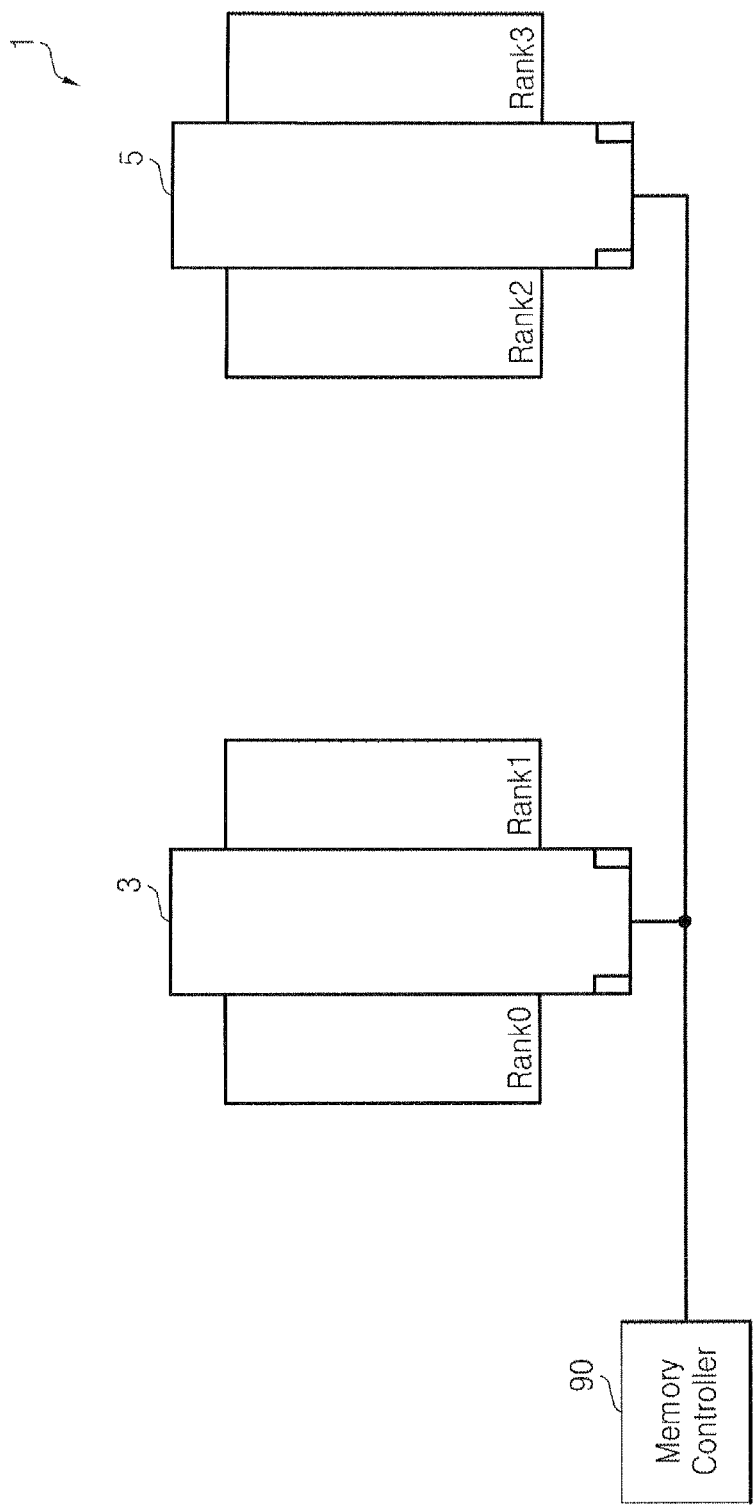
FIG. 2 is a side view illustrating the memory system illustrated in FIG. 1.

FIG. 1 is a block diagram of a memory system 1 according to an embodiment of the inventive concept. FIG. 2 is a side view of the memory system 1 illustrated in FIG. 1. Referring to FIGS. 1 and 2, the memory system 1 includes a plurality of memory modules 3 and 5 and a memory controller 90.

According to an embodiment, each of the memory modules 3 and 5 is implemented as a dual in-line memory module (DIMM). Alternatively, each of the memory modules 3 and 5 is implemented as a dual in-line package (DIP) memory module, a single in-line pin package (SIPP) memory module, a single in-line memory module (SIMM), or a small outline DIMM (SO-DIMM).

Each of the memory modules 3 and 5 includes a plurality of ranks Rank0 and Rank1 or Rank2 and Rank3. Each of the ranks Rank0 through Rank3 includes a plurality of memory devices 10-1 through 10-$m$ (where "m" is a natural number). According to an embodiment, each of the memory devices 10-1 through 10-$m$ is implemented as a dynamic random access memory (DRAM), but is not restricted thereto.

Figure 3:
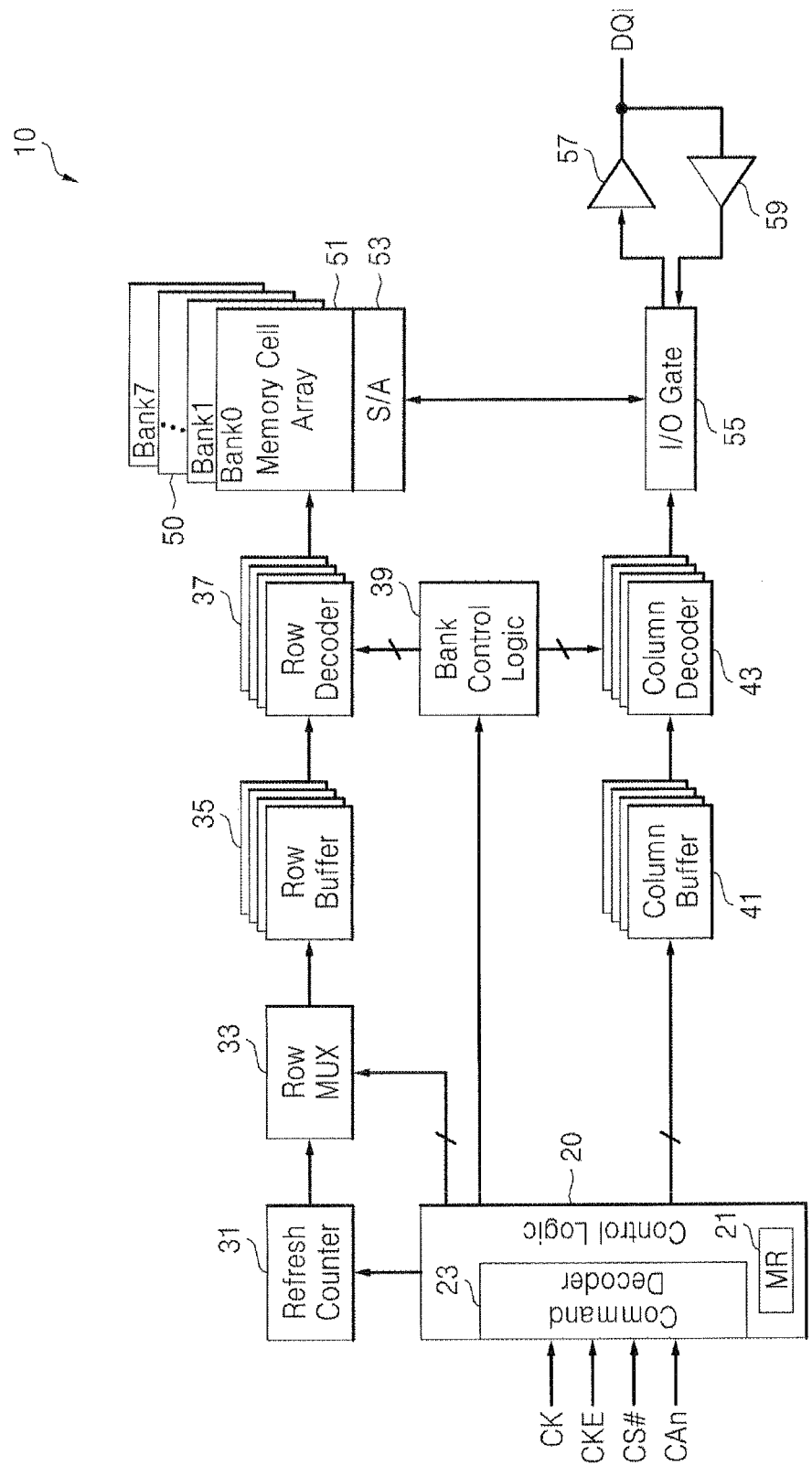
FIG. 3 is a block diagram illustrating a memory device 10 illustrated in FIG. 1.

FIG. 3 is a block diagram of a memory device 10 as illustrated in FIG. 1. Referring to FIGS. 1 through 3, the memory device 10 illustrated in FIG. 3 is an example of any one of the memory devices 10-1 through 10-$m$ illustrated in FIG. 1.

The memory device 10 includes a control logic 20, a refresh counter 31, a row multiplexer 33, a plurality of row buffers 35, a plurality of row decoders 37, a bank control logic 39, a plurality of column buffers 41, a plurality of column decoders 43, a plurality of banks 50, an input/output (I/O) gate 55, an output driver 57, and an input buffer 59.

The control logic 20 controls the elements 31, 33, 39, and 41 in response to a plurality of signals CK, CKE, CS# and CAn. The symbol "#" indicates low activation. According to an embodiment, the clock signal CK and the clock enable signal CKE are output from a clock driver (not shown).

The chip enable signal CS# and a plurality of command/address signals CAn (where "n" is 0 to an integer greater than 0) are output from the memory controller 90.

The control logic 20 includes a mode register 21 and a command decoder 23.

The mode register 21 stores control bits for controlling various operation modes of the memory device 10. For instance, the mode register 21 stores control bits for masking at least one of the banks 50.

The command decoder 23 decodes the signals CKE, CS# and CAn and generates a command and/or an address for controlling each of the elements 31, 33, 39 and 41 based on a decoding result.

For instance, as shown in Table 1, when the clock enable signal CKE is at a high level at a rising edge of a previous clock signal CK(n−1) and at a rising edge of a current clock signal CK(n), the chip enable signal CS# is at a low level, and four command/address signals CA0 through CA3 among a plurality of command/address signals CA0 through CA9 are at a low level, the command decoder 23 outputs or issues a mode register writing command MRW to mask at least one of the banks 50.

TABLE 1

| | CKE | | | | | | | | | | | | | CK |
|---|---|---|---|---|---|---|---|---|---|---|---|---|---|---|
| CMD | CK(n−1) | CK(n) | CS# | CA0 | CA1 | CA2 | CA3 | CA4 | CA5 | CA6 | CA7 | CA8 | CA9 | edge |
| MRW | H | H | L | L | L | L | L | MA0 | MA1 | MA2 | MA3 | MA4 | MA5 | Rising edge |

Here, when the signals CKE and CS# are respectively input to single data rate (SDR) command pins, and the ten command/address signals CA0 through CA9 are respectively input to double data rate command address (DDR CA) pins, MRW denotes the mode register writing command, CK(n−1) denotes the previous clock signal, CK(n) denotes the current clock signal, "H" denotes the high level, "L" denotes the low level, and MA0 through MA5 denote bits for recognizing the mode register 21.

When the mode register writing command MRW is issued, at least one (e.g., Bank0) of the banks 50 may be masked. In other words, a read command, a write command, or a per-bank refresh command is not executed but is skipped in the masked bank Bank0.

Masking of each of the banks 50 may be determined by the control bits of the mode register 21. For instance, as shown in Table 2, when the clock enable signal CKE is at the high level at a rising edge of a previous clock signal CK(n−1) and at a rising edge of a current clock signal CK(n) and when the chip enable signal CS# is at the low level, the control bits may be set according to the plurality of command/address signals at a falling edge of the clock signal CK.

TABLE 2

| CMD | CKE | | CK |  |  |  |  |  |  |  |  |  |  |
|---|---|---|---|---|---|---|---|---|---|---|---|---|---|
|  | CK(n−1) | CK(n) | CS# | CA0 | CA1 | CA2 | CA3 | CA4 | CA5 | CA6 | CA7 | CA8 | CA9 | edge |
| MRW | H | H | L | MA6 | MA7 | OP0 | OP1 | OP2 | OP3 | OP4 | OP5 | OP6 | OP7 | Falling edge |

Here, MRW denotes the mode register writing command, CK(n−1) denotes the previous clock signal, CK(n) denotes the current clock signal, "H" denotes the high level, "L" denotes the low level, MA6 and MA7 denote bits for recognizing the mode register 21, and OP0 through OP7 denote the control bits.

When a control bit has a first value, e.g., "0", it means that a bank corresponding to the control bit is unmasked. When the control bit has a second value, e.g., "1", it means that the corresponding bank is masked.

For instance, when the control bits are "00000001", the first bank Bank0 is masked. When the control bits are "10000000", the eighth bank Bank7 is masked. In other words, when control bits include K bits, the value of each bit indicates whether a corresponding bank is masked or unmasked.

As shown in Table 3, when the clock enable signal CKE is at the high level at a rising edge of the previous clock signal CK(n−1) and at a rising edge of the current clock signal CK(n), the chip enable signal CS# is at the low level, a plurality of command/address signals CA0, CA1, and CA3 among the command/address signals CA0 through CA9 are at the low level, and the third command/address signal CA2 is at a high level, the command decoder 23 outputs or issues a per-bank refresh command PBR.

Here, PBR denotes the per-bank refresh command, and "x" denotes "don't care". In Table 3, the first, second and fourth command/address signals CA0, CA1 and CA3 are at the low level, and the third command/address signal CA2 is at the high level.

A refresh operation is performed on a bank (e.g., Bank0) that is scheduled by the bank control logic 39 according to the per-bank refresh command PBR.

The bank control logic 39 selects each of the banks 50 in a sequential round-robin fashion. In other words, when the number of the banks 50 is 8, the bank control logic 39 may sequentially select the banks 50 in order of "0-1-2-3-4-5-6-7-0-1 . . . ", where the numerals denote bank numbers in the memory device 10. The number of the banks 50 included in the memory device 10 may be different in different embodiments.

The refresh counter 31 generates a row address in response to the per-bank refresh command PBR to execute a refresh command. In other words, in response to the per-bank refresh command PBR, the bank control logic 39 counts rows included in one of the banks 50 before the bank control logic 39 switches a bank that the refresh command will be executed on to another bank.

The row multiplexer 33 selects a row address generated by the refresh counter 31 or a row address output from the control logic 20 in response to a selection signal (not shown). When a refresh operation is performed, the row multiplexer 33 selects the row address counted by the refresh counter 31. In a write or read operation, the row multiplexer 33 selects the row address output from the control logic 20.

The row buffers 35 temporarily store the row address output from the row multiplexer 33.

Among the row decoders 37, a first row decoder corresponding to a bank switched-on by the bank control logic 39 decodes the row address output from a first row buffer corresponding to the first row decoder and selects a row (or word line) among a plurality of rows (or word lines) according to a decoding result.

The banks 50 include memory cell arrays 51, respectively, labeled Bank0 through Bank7, respectively, and sense amplifiers 53, respectively.

Each of the memory cell arrays 51 includes a plurality of word lines (or rows), a plurality of bit lines (or columns), and a plurality of memory cells for storing data.

TABLE 3

| CMD | CKE | | CK |  |  |  |  |  |  |  |  |  |  |
|---|---|---|---|---|---|---|---|---|---|---|---|---|---|
|  | CK(n−1) | CK(n) | CS# | CA0 | CA1 | CA2 | CA3 | CA4 | CA5 | CA6 | CA7 | CA8 | CA9 | edge |
| PBR | H | H | L | L | L | H | L | x | x | x | x | x | x | Rising edge |

Each of the sense amplifiers 53 senses and amplifies a voltage change in each bit line.

The column buffers 41 temporarily store a column address output from the control logic 20. Among the column decoders 43, a first column decoder 43 corresponding to a bank switched-on by the bank control logic 39 decodes the column address output from a first column buffer 41 corresponding to the first column decoder 43 and generates a plurality of column selection signals according to a decoding result.

The I/O gate 55 transmits data or signals to a sense amplifier 53, the output driver 57, or the input buffer 59 according to the plurality of column selection signals output from one of the column decoders 43.

In a write operation, the I/O gate 55 transmits data DQi (where "i" is a natural number) from the input buffer 59 to the memory cell arrays 51 via a driver (not shown) according to the column selection signals output from one of the column decoders 43. In a read operation, the I/O gate 55 transmits signals sensed and amplified by the sense amplifiers 53 to the output driver 57 as data DQi according to the column selection signals output from one of the column decoders 43. The output driver 57 outputs the data DQi to the memory controller 90.

Figure 4:
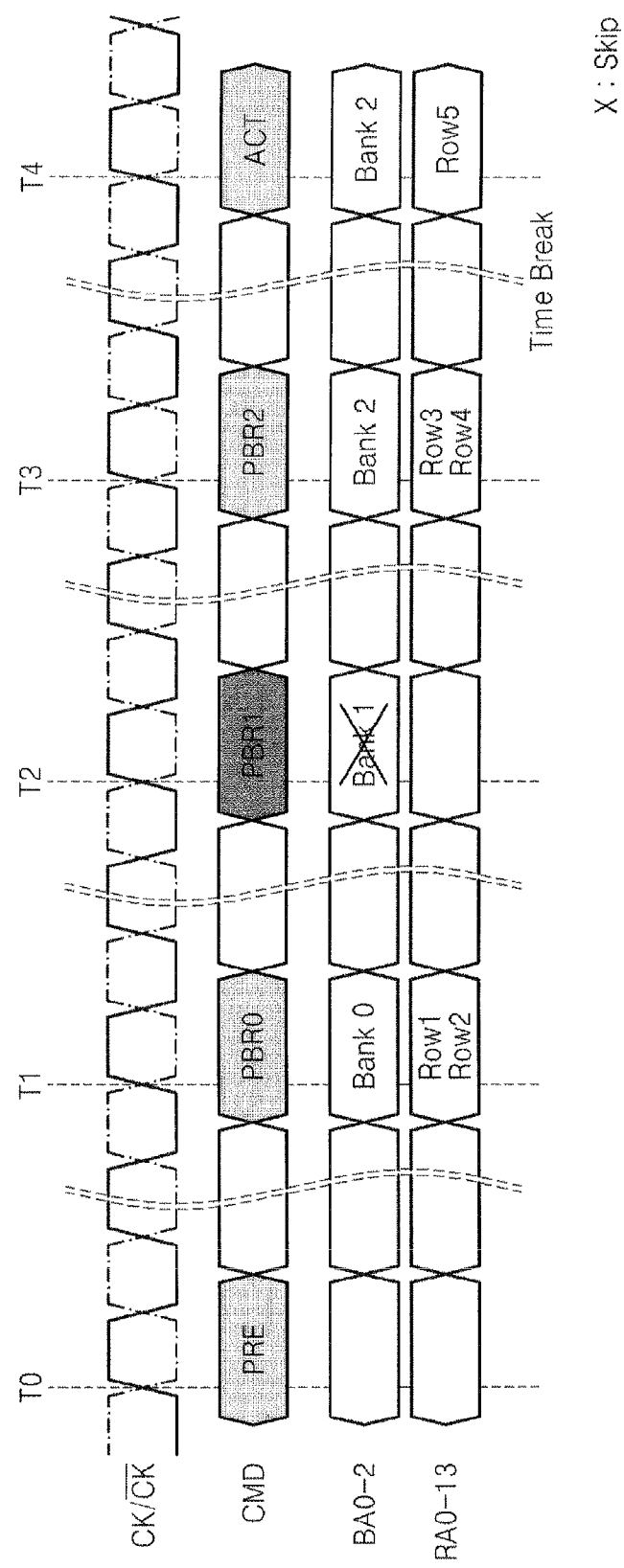
FIG. 4 is a timing chart showing the operation of the memory device illustrated in FIG. 3 according to some embodiments of the inventive concept.

FIG. 4 is a timing chart showing the operation of the memory device 10 illustrated in FIG. 3 according to an embodiment of the inventive concept. Referring to FIGS. 3 and 4, for purposes of illustration, among the banks 50, the banks Bank1 and Bank3 are masked in response to a mode register writing command.

The command decoder 23 decodes the signals CKE, CS#, and CAn according to an edge of the clock signal CK and generates a command CMD based on a decoding result. The command CMD includes a precharge command PRE, a first per-bank refresh command PBR0, a second per-bank refresh command PBR1, a third per-bank refresh command PBR2, or an activate command ACT.

As shown in Table 4, the precharge command PRE is used to precharge an activated bank (e.g., Bank0) to a predetermined voltage. When the clock enable signal CKE is at the high level at a rising edge of the previous clock signal CK(n−1) and at a rising edge of the current clock signal CK(n), the chip enable signal CS# is at the low level, three command/address signals (e.g., CA0, CA1, and CA3) among the command/address signals CA0 through CA9 are at a high level, and one (e.g., CA2) of the command/address signals CA0 through CA9 is at a low level at a first time point T0, the command decoder 23 decodes the signals CKE, CS# and CAn and generates the precharge command PRE according to a decoding result.

For instance, when the bit value of AB is "1", all of the banks 50 are precharged regardless of the values of the bits BA0 through BA2. When the bit value of AB is "0" and the values of all bits BA0 through BA2 are "0", the first bank Bank0 is precharged. When the bit value of AB is "0" and the values of the bits BA0 through BA2 are respectively "0", "0", and "1", the second bank Bank1 is precharged. In Table 4, the first and second command/address signals CA0 and CA1 are at the high level, and the third command/address signal CA2 is at the low level.

The first per-bank refresh command PBR0 is generated at a rising edge of the clock signal CK at a second time point T1. In response to the first per-bank refresh command PBR0, a plurality of rows ROW1 and ROW2 in the first bank Bank0 are refreshed. The rows ROW1 and ROW2 are word lines that are selected according to a result of decoding a plurality of row addresses RA0 through RA13 using a row decoder 37 corresponding to the first bank Bank0 among the row decoders 37.

In response to the first per-bank refresh command PBR0, a refresh operation is performed on the first bank Bank0. Thereafter, the bank control logic 39 switches from the first bank Bank0 to the second bank Bank1. The second per-bank refresh command PBR1 is generated at a rising edge of the clock signal CK at a third time point T2. Since the second bank Bank1 is masked by the mode register writing command, the second bank Bank1 is not refreshed. In other words, the second bank Bank1 is skipped. In FIG. 4, X indicates a skip.

The bank control logic 39 switches from the second bank Bank1 to the third bank Bank2. The third per-bank refresh command PBR2 is generated at a rising edge of the clock signal CK at a fourth time point T3. In response to the third per-bank refresh command PBR2, a plurality of rows ROW3 and ROW4 included in the third bank Bank2 are refreshed. After the refresh operation is performed on the third bank Bank2 in response to the third per-bank refresh command PBR2, the bank control logic 39 switches from the third bank Bank2 to the fourth bank Bank3.

According to an embodiment, the activate command ACT is applied before the read or write operation. In response to the activate command ACT, a row ROW5 in at least one (e.g., Bank2) of the banks 50 is activated.

As shown in Table 5, when the clock enable signal CKE is at the high level at a rising edge of the previous clock signal CK(n−1) and at a rising edge of the current clock signal CK(n), the chip enable signal CS# is at the low level, one (e.g., CA1) of the command/address signals CA0 through CA9 is at the high level, and another one (e.g., CA0) of the command/

TABLE 4

| | CKE | | | | | | | | | | | | | CK |
|---|---|---|---|---|---|---|---|---|---|---|---|---|---|---|
| CMD | CK(n − 1) | CK(n) | CS# | CA0 | CA1 | CA2 | CA3 | CA4 | CA5 | CA6 | CA7 | CA8 | CA9 | edge |
| PRE | H | H | L | H | H | L | AB | x | x | x | BA0 | BA1 | BA2 | Rising edge |

Here, PRE denotes the precharge command, AB denotes a flag, and BA0 through BA2 denote bank address bits. AB and BA0 through BA2 are used to determine which of the banks 50 will be precharged.

address signals CA0 through CA9 is at the low level at a fifth time point T4, the command decoder 23 decodes the signals CKE, CS# and CAn and generates the activate command ACT according to a decoding result.

TABLE 5

| CMD | CKE | | CS# | CA0 | CA1 | CA2 | CA3 | CA4 | CA5 | CA6 | CA7 | CA8 | CA9 | CK |
| | CK(n−1) | CK(n) | | | | | | | | | | | | edge |
|---|---|---|---|---|---|---|---|---|---|---|---|---|---|---|
| ACT | H | H | L | L | H | R8 | R9 | R10 | R11 | R12 | BA0 | BA1 | BA2 | Rising edge |

Here, ACT denotes the activate command, R8 through R12 denote row address bits, and BA0 through BA2 denote bank address bits. The bank address bits BA0 through BA2 are used to select one of the banks 50. The row address bits R8 through R12 are used to determine a row to be activated in the selected bank 50. In Table 5, the first command/address signal CA0 is at the low level, and the second command/address signal CA1 is at the high level.

Figure 5:
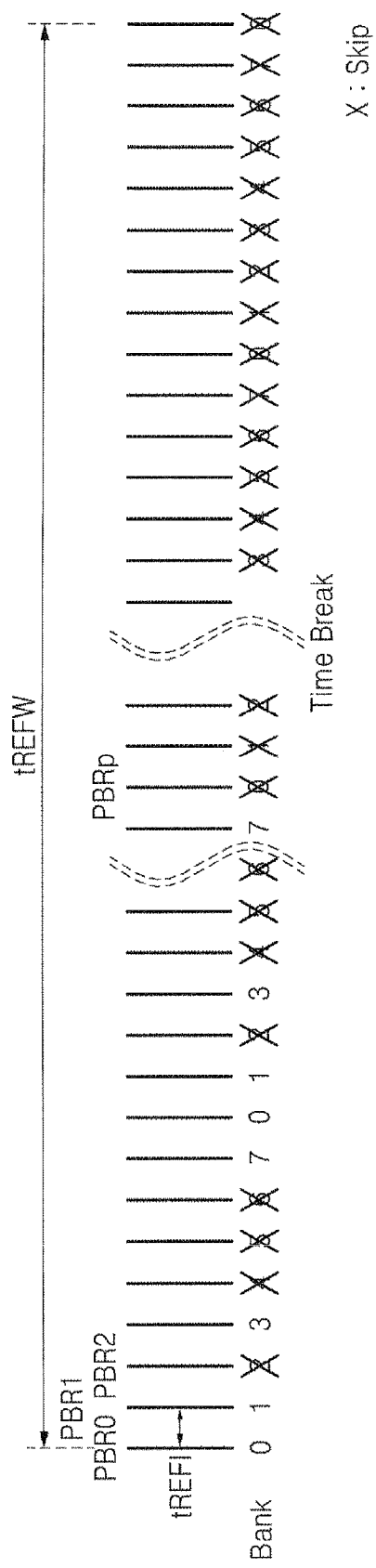
FIG. 5 is a timing chart showing the operation of the memory device illustrated in FIG. 3 according to other embodiments of the inventive concept.

FIG. 5 is a timing chart showing the operation of the memory device 10 illustrated in FIG. 3 according to an embodiment of the inventive concept. Referring to FIGS. 3 and 5, the memory device 10 includes a minimum number of per-bank refresh commands PBR1 through PBRp (where "p" is a natural number) within a refresh window tREFW.

For purposes of illustration, the banks Bank2, Bank4, Bank5, and Bank6 among the banks 50 are masked in response to a mode register writing command. A plurality of rows included in each of the other banks Bank0, Bank1, Bank3 and Bank7 among the banks 50 are refreshed in response to the per-bank refresh commands PBR 0 through PBRp, respectively.

In FIG. 5, X indicates a skip of a per-bank refresh command. In other words, the per-bank refresh command is not executed in the banks Bank2, Bank4, Bank5, and Bank6.

Due to the skipped per-bank refresh commands, an average time tREFI between refresh commands (e.g., PBR0 and PBR1) may be increased.

Figure 6:
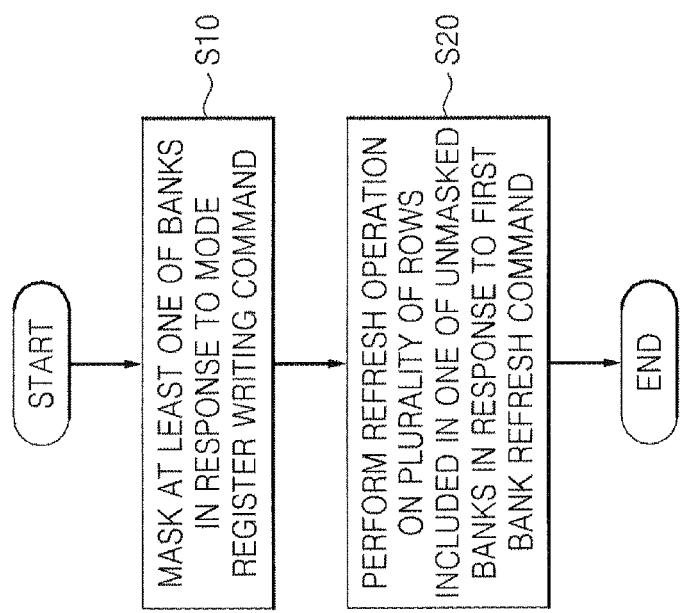
FIG. 6 is a flowchart of a method of operating the memory device illustrated in FIG. 3 according to some embodiments of the inventive concept.

When the average time tREFI between refresh commands (e.g., PBR0 and PBR1) is increased, the memory controller 90 can reduce the number of issues of a refresh command FIG. 6 is a flowchart of a method of operating the memory device 10 illustrated in FIG. 3 according to an embodiment of the inventive concept. Referring to FIGS. 3 through 6, the memory device 10 masks at least one (e.g., Bank1) of the banks 50 in response to a mode register writing command in operation S10.

The memory device 10 performs a refresh operation on a plurality of rows (e.g., ROW1 and ROW2) included in one (e.g., Bank0) of banks 50, which are unmasked, in response to a first per-bank refresh command in operation S20.

The refresh counter 31 counts rows included in the first bank Bank0 in response to the first per-bank refresh command before the bank control logic 39 switches to the second bank Bank1. After the execution of the first per-bank refresh command, the bank control logic 39 switches from the first bank Bank0 to the second bank Bank1.

Figure 7:
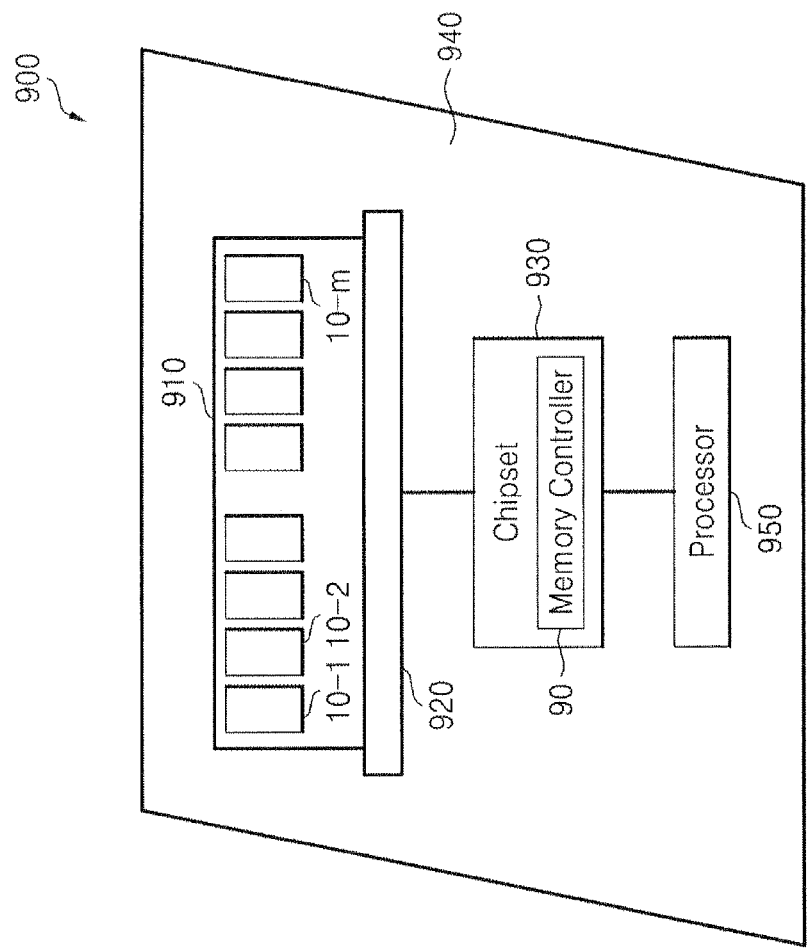
FIG. 7 is a block diagram of a memory system according to other embodiments of the inventive concept.

FIG. 7 is a block diagram of a memory system 900 according to an embodiment of the inventive concept. Referring to FIGS. 3 and 7, according to an embodiment, the memory system 900 is implemented as a personal computer (PC), a table PC, or a mobile computing device. The memory system 900 includes a main board 940, a slot 920 mounted on the main board 940, a memory module 910 inserted into the slot 920, a chipset 930 that controls the operation of the memory devices 10-1 through 10-m installed in the memory module 910 via the slot 920, and a processor 950 that communicates with the memory devices 10-1 through 10-m.

According to an embodiment, each of the memory devices 10-1 through 10-m includes the memory device 10 illustrated in FIG. 3.

For purposes of the description, only one memory module 910 is illustrated in FIG. 7, but according to an embodiment, the memory system 900 may include one or more memory modules. The chipset 930 is used for transmission of data, addresses, or control signals between the processor 950 and the memory module 910. The chipset 930 includes the memory controller 90. In an embodiment, the memory controller 90 is implemented in the processor 950.

Figure 8:
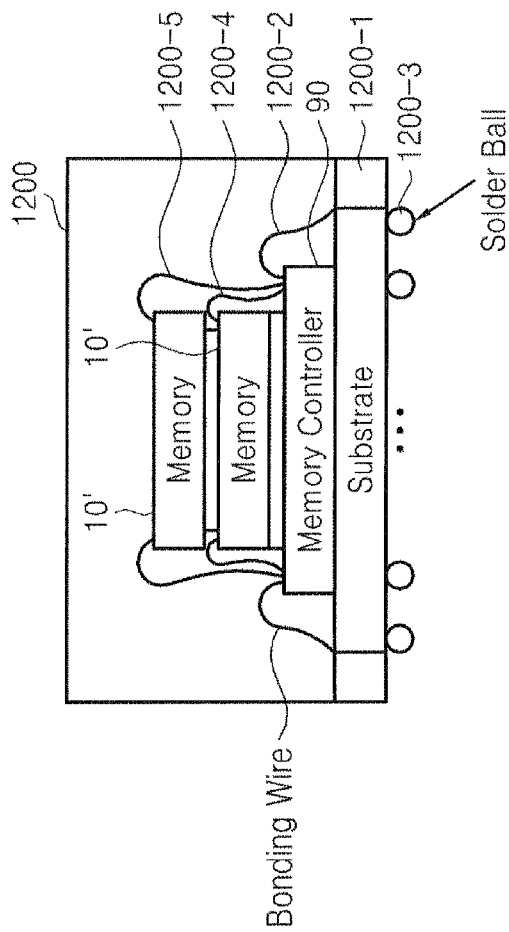
FIG. 8 is a diagram of a multi-chip package including the memory device illustrated in FIG. 1.

FIG. 8 is a diagram of a multi-chip package 1200 including a memory device 10' according to an embodiment of the inventive concept. Referring to FIGS. 3 and 8, the multi-chip package 1200 includes the memory controller 90 formed on a circuit substrate 1200-1, e.g., a printed circuit board (PCB), and a plurality of memory devices 10' formed on the memory controller 90. According to an embodiment, each of the memory devices 10' is implemented as the memory device 10 illustrated in FIG. 3.

The memory controller 90 communicates with an external device through bonding wires 1200-2 and solder balls 1200-3. The memory controller 90 also communicates with the memory devices 10' through bonding wires 1200-4 and 1200-5.

For purposes of the description, the memory devices 10' are formed on the memory controller 90 in FIG. 8, but according to an embodiment, the positions of the elements 10' and 90 are exchanged with each other. The memory controller 90 communicates with the memory devices 10' using connection means other than the bonding wires 1200-4 and 1200-5, and the memory controller 90 is connected with the solder balls 1200-3 using connection means other than the bonding wires 1200-2. According to an embodiment, the connection means includes a vertical electrical element, e.g., a through silicon via (TSV).

According to the embodiments of the inventive concept, a memory device performs a refresh operation on a plurality of rows in a bank, thereby increasing an average time between refresh commands.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A method of operating a memory device, the method comprising:
    masking at least one bank among a plurality of banks in response to a mode register writing command; and
    performing a refresh operation on a plurality of rows in one of unmasked banks in response to a first per-bank refresh command.

2. The method of claim 1, wherein even when a second per-bank refresh command is received, the refresh operation is not performed in the masked bank.

3. The method of claim 1, wherein the masked bank is determined according to a mode register setting.

4. The method of claim 1, wherein the mode register writing command is issued when a clock enable signal is at a high level at a rising edge of a clock signal, a chip enable signal is at a low level, and a plurality of command/address signals are at a low level.

5. The method of claim 1, wherein the first per-bank refresh command is issued when a clock enable signal is at a high level at a rising edge of a clock signal, a chip enable signal is at a low level, a first command/address signal is at a low level, a second command/address signal is at a low level, a third command/address signal is at a high level, and a fourth command/address signal is at a low level.

6. A memory device comprising:
   a plurality of banks, at least one of the banks including a plurality of rows; and
   a command decoder configured to issue a mode register writing command and a first per-bank refresh command according to a clock signal, a clock enable signal, a chip enable signal, and a plurality of command/address signals,
   wherein when at least one of the plurality of banks is masked in response to the mode register writing command, a refresh operation is performed on a plurality of rows included in a first bank among unmasked banks in response to the first per-bank refresh command.

7. The memory device of claim 6, further comprising a bank control logic configured to switch from the first bank to a second bank in response to the first per-bank refresh command.

8. The memory device of claim 6, further comprising a refresh counter configured to count the plurality of rows in response to the first per-bank refresh command.

9. The memory device of claim 6, wherein the command decoder includes a mode register configured to select the masked bank.

10. The memory device of claim 6, wherein when the command decoder issues a second per-bank refresh command, the refresh operation is not performed in the masked bank.

11. The memory device of claim 6, wherein the mode register writing command is issued when the clock enable signal is at a high level at a rising edge of the clock signal, the chip enable signal is at a low level, and four of the plurality of command/address signals are at a low level.

12. The memory device of claim 6, wherein the first per-bank refresh command is issued when the clock enable signal is at a high level at a rising edge of the clock signal, the chip enable signal is at a low level, three of the command/address signals are at a low level, and one of the command/address signals is at a high level.

13. A memory module comprising at least one rank including the memory device of claim 6.

14. The memory module of claim 13, wherein the memory module includes at least one of a dual in-line memory module (DIMM), a dual in-line package (DIP) memory module, a single in-line pin package (SIPP) memory module, a single in-line memory module (SIMM), or a small outline DIMM (SO-DIMM).

15. A method of operating a memory device, the method comprising:
   generating a mode register writing command or a bank refresh command according to values of a clock signal, a clock enable signal, a chip selection signal, and a plurality of command/address signals;
   masking at least one of a plurality of banks included in the memory device when receiving the mode register writing command; and
   skipping a refresh operation on word lines included in the masked bank when receiving the bank refresh command.

16. The method of claim 15, wherein the mode register writing command is generated when the clock enable signal is at a high level, the clock signal is at a rising edge, the chip enable signal is at a low level, and the plurality of command/address signals are at a low level.

17. The method of claim 15, wherein the bank refresh command is generated when the clock enable signal is at a high level, the clock signal is at a rising edge, the chip enable signal is at a low level, a first command/address signal of the command/address signals is at a low level, a second command/address signal of the command/address signals is at a low level, a third command/address signal of the command/address signals is at a high level, and a fourth command/address signal of the command/address signals is at a low level.

18. The method of claim 15, further comprising performing the refresh operation on word lines included in an unmasked bank of the plurality of banks when receiving the bank refresh command.

19. The method of claim 18, further comprising making a shift from the unmasked bank to a subsequent bank and performing the refresh operation on the subsequent bank when the subsequent bank is an unmasked bank or skipping the refresh operation on the subsequent bank when the subsequent bank is a masked bank.

20. The method of claim 15, further comprising activating word lines included in at least one of the banks when receiving an activate command.

* * * * *